United States Patent
Hamano et al.

(10) Patent No.: US 9,738,072 B2
(45) Date of Patent: Aug. 22, 2017

(54) ACTUATOR, INK-JET HEAD, AND INK-JET DEVICE

(71) Applicant: Panasonic Intellectual Property Management Co., Ltd., Osaka (JP)

(72) Inventors: Takafumi Hamano, Fukuoka (JP); Akira Gyoutoku, Saga (JP); Shintarou Hara, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/205,501

(22) Filed: Jul. 8, 2016

(65) Prior Publication Data
US 2017/0028727 A1    Feb. 2, 2017

(30) Foreign Application Priority Data
Jul. 28, 2015   (JP) .................. 2015-149009

(51) Int. Cl.
| | |
|---|---|
| B41J 2/14 | (2006.01) |
| H01L 41/08 | (2006.01) |
| H01L 41/053 | (2006.01) |
| H01L 41/09 | (2006.01) |
| H01L 41/18 | (2006.01) |

(52) U.S. Cl.
CPC ...... *B41J 2/14233* (2013.01); *H01L 41/0533* (2013.01); *H01L 41/0815* (2013.01); *H01L 41/0973* (2013.01); *H01L 41/18* (2013.01)

(58) Field of Classification Search
CPC .. B41J 2/14233; H01L 41/0973; H01L 41/18; H01L 41/0533
See application file for complete search history.

(56) References Cited

U.S. PATENT DOCUMENTS

2011/0228015 A1* 9/2011 Ohashi ................ B41J 2/14233
                                                          347/71

FOREIGN PATENT DOCUMENTS

JP    2002-252390    9/2002

\* cited by examiner

*Primary Examiner* — Geoffrey Mruk
(74) *Attorney, Agent, or Firm* — McDermott Will & Emery LLP

(57) ABSTRACT

An actuator includes a piezoelectric layer, a vibration plate, and a reduction inhibition layer. The piezoelectric layer includes an oxide material. The vibration plate is disposed below the piezoelectric layer, and configured to deform when the piezoelectric layer deforms. The reduction inhibition layer is disposed between the piezoelectric layer and the vibration plate, and configured to inhibit reduction reaction in the piezoelectric layer.

13 Claims, 10 Drawing Sheets

ACTUATOR, INK-JET HEAD, AND INK-JET DEVICE

BACKGROUND

1. Technical Field

The present disclosure relates to an actuator using a piezoelectric thin film, and an ink-jet head and an ink-jet device that use the actuator.

2. Description of the Related Art

An ink-jet device performs printing and drawing on a print surface by ejecting ink from an ink-jet head. The ink-jet head mounted on the ink-jet device includes a pressure chamber to be filled with ink, a flow path for guiding the ink to the pressure chamber, a nozzle communicated with the pressure chamber, and an actuator configured to apply pressure to the ink filled in the pressure chamber. The actuator is driven to increase pressure within the pressure chamber and eject the ink filled in the pressure chamber from the nozzle.

The ink-jet head configured as described above can include a piezoelectric thin film as a drive source of the actuator. With this configuration, for example, the piezoelectric thin film is formed opposite to the nozzle with the pressure chamber interposed between the piezoelectric thin film and the nozzle. The piezoelectric thin film deforms when voltage is applied on the piezoelectric thin film, and the volume of the pressure chamber decreases accordingly. This increases the pressure within the pressure chamber, so that the ink is ejected from the nozzle.

Unexamined Japanese Patent Publication No. 2002-252390 discloses a method of forming a Ni alloy electrode for applying voltage to a piezoelectric body.

SUMMARY

A first aspect of the present disclosure relates to an actuator using a piezoelectric thin film. The actuator according to the first aspect includes a piezoelectric layer, a vibration plate, and a reduction inhibition layer. The piezoelectric layer includes an oxide material. The vibration plate is disposed below the piezoelectric layer, and configured to deform when the piezoelectric layer deforms. The reduction inhibition layer is disposed between the piezoelectric layer and the vibration plate, and configured to inhibit reduction reaction in the piezoelectric layer.

In the actuator according to the present aspect, the reduction inhibition layer inhibits reduction reaction in the piezoelectric layer. This prevents denaturation of the piezoelectric layer such as leakage current flowing in the piezoelectric layer even when the actuator is continuously used at high temperature. Accordingly, the characteristic of the actuator can be reliably maintained.

The first aspect includes the "reduction inhibition layer disposed between the piezoelectric layer and the vibration plate". Such a configuration also includes a configuration in which the reduction inhibition layer is disposed separately from the vibration plate, and a configuration in which the reduction inhibition layer is included in the vibration plate.

A second aspect of the present disclosure relates to an ink-jet head. The ink-jet head according to the second aspect includes the actuator according to the first aspect, a pressure chamber, and a nozzle. The pressure chamber is filled with ink and configured to change the pressure of the ink when the actuator is driven. The nozzle is configured to eject the ink filled in the pressure chamber when the actuator is driven.

A third aspect of the present disclosure relates to an ink-jet device. The ink-jet device according to the third aspect includes the ink-jet head according to the second aspect, and an ink supplying unit. The ink supplying unit is configured to supply ink to the ink-jet head.

Similarly to the first aspect, the second and third aspects can achieve the ink-jet head and the ink-jet device that are capable of preventing denaturation of the piezoelectric thin film even when used at high temperature.

As described above, the present disclosure provides the actuator capable of preventing denaturation of the piezoelectric thin film even when used at high temperature, and the ink-jet head and the ink-jet device that include the actuator.

The effect and purpose of the present disclosure will be further clearly described in the following explanation of an exemplary embodiment. The exemplary embodiment described below is, however, merely one example for achieving the present disclosure, and does not limit the present disclosure in any way.

DETAILED DESCRIPTION OF EMBODIMENT

Any problem with the conventional configuration will be described below followed by description of an exemplary embodiment of the present disclosure. Recently, a need for use of an ink-jet head at various temperatures has been increasing. For example, a higher temperature of the ink-jet head enables use of ink having a viscosity higher than normal ink.

However, when a piezoelectric thin film is used as a drive source of an actuator as described above, continuous use of the ink-jet head at high temperature for a certain period of time causes denaturation of the piezoelectric thin film, and the characteristic of the piezoelectric thin film potentially degrades. The inventors of the present application have confirmed that continuous use of the ink-jet head at high temperature causes denaturation of piezoelectric thin film such as leakage current flowing in the piezoelectric thin film when the material of the piezoelectric thin film is lead zirconate titanate (PZT).

To solve this problem, the present disclosure provides an actuator capable of preventing denaturation of the piezoelectric thin film when used at high temperature, and an ink-jet head and an ink-jet device that use the actuator.

The exemplary embodiment of the present disclosure will be described below with reference to the accompanying drawings. For the purpose of convenience, each drawing includes mutually orthogonal X, Y, and Z axes. The Z-axis direction is aligned with the height direction of ink-jet head 1, and the positive Z-axis direction points the downward direction. The X-axis direction is aligned with the thickness direction of ink-jet head 1, and the Y-axis direction is aligned with the width direction of ink-jet head 1. Ink-jet head 1 ejects ink in the positive Z-axis direction (downward direction).

Figure 1A:
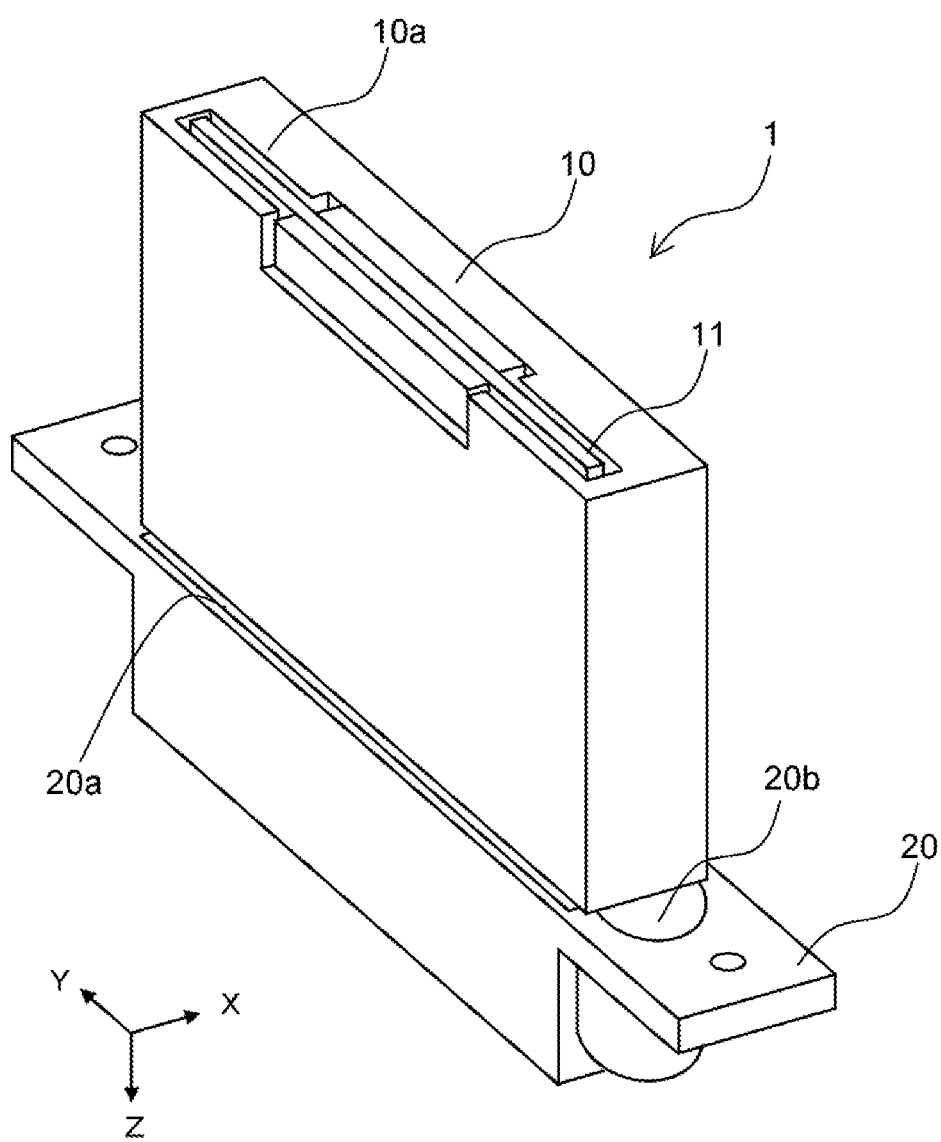
FIG. 1A illustrates the configuration of an ink-jet head according to an exemplary embodiment.
Figure 1B:
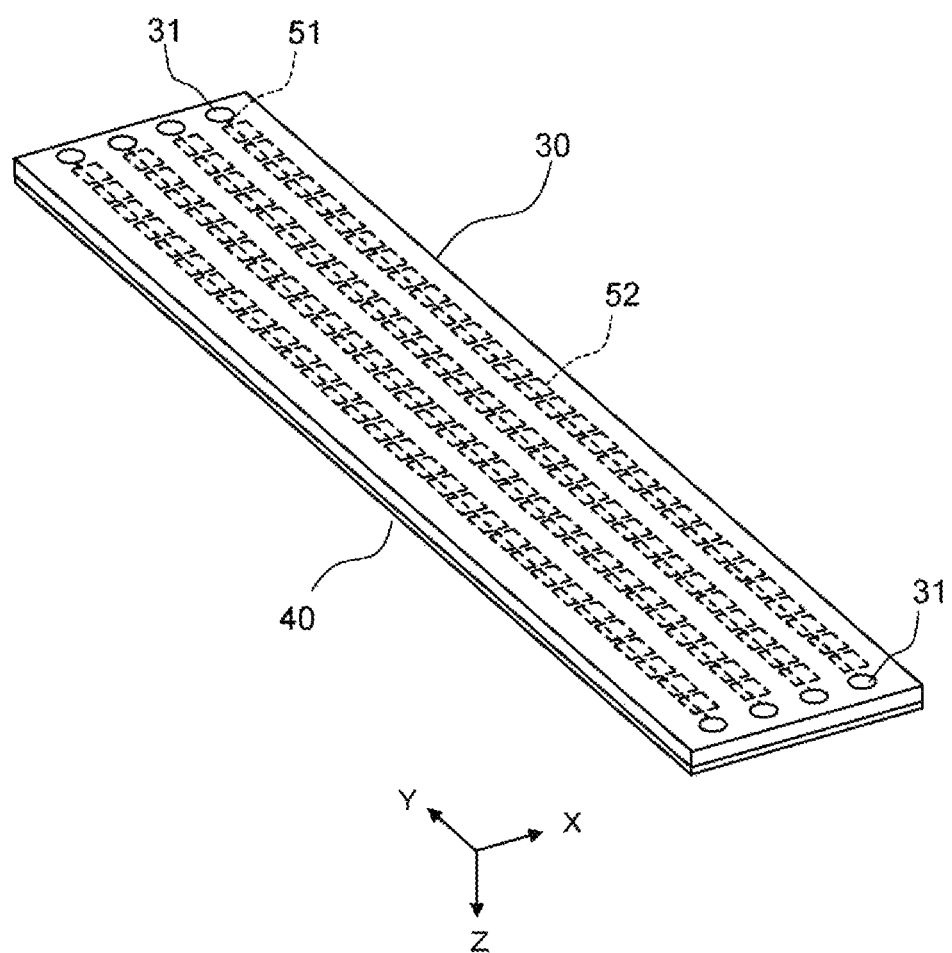
FIG. 1B schematically illustrates a configuration in which an actuator and a structured body according to the exemplary embodiment are combined.

FIG. 1A illustrates the configuration of ink-jet head 1 according to an exemplary embodiment. FIG. 1B schematically illustrates a configuration in which actuator 30 and structured body 40 according to the exemplary embodiment are combined.

As illustrated in FIG. 1A, ink-jet head 1 includes housing box 10 and head base 20. Housing box 10 is detachably attached to head base 20.

Housing box 10 is a rectangular box with no lower surface. Notch 10a communicated with the inside of housing box 10 is provided on upper surface of housing box 10. Circuit board 11 is housed in housing box 10 through notch 10a. Drive circuit for driving actuator 30 is mounted on circuit board 11.

Head base 20 is a frame having vertically penetrating rectangular opening 20a at a central part. Circular holes 20b continuous with opening 20a are provided on positive and negative Y-axis sides of opening 20a. Actuator 30 and structured body 40 illustrated in FIG. 1B are installed at the lower end of opening 20a. Actuator 30 is electrically connected with circuit board 11 in opening 20a. Holes 20b are used to guide an ink-supplying tube (not illustrated) to the inside of opening 20a.

As illustrated in FIG. 1B, actuator 30 is a plate having a rectangular outline. Actuator 30 is placed on the upper surface of structured body 40. Structured body 40 is a plate having a rectangular outline. Structured body 40 is provided with four main flow paths 51 arranged side by side in the X-axis direction.

Four vertically penetrating ink supply inlets 31 are formed side by side in the X-axis direction at each of end parts of actuator 30 on the positive and negative Y-axis sides. Each pair of ink supply inlets 31 opposite to each other in the Y-axis direction is connected with corresponding main flow path 51. A groove is formed on the back surface of actuator 30. Actuator 30 is placed on plate-shape structured body 40 to form pressure chamber 52 between the upper surface of structured body 40 and the groove on the back surface of actuator 30. Pressure chamber 52 is connected with main flow path 51 through communicating flow path 53 (refer to FIG. 2B) formed in structured body 40.

Figure 2A:
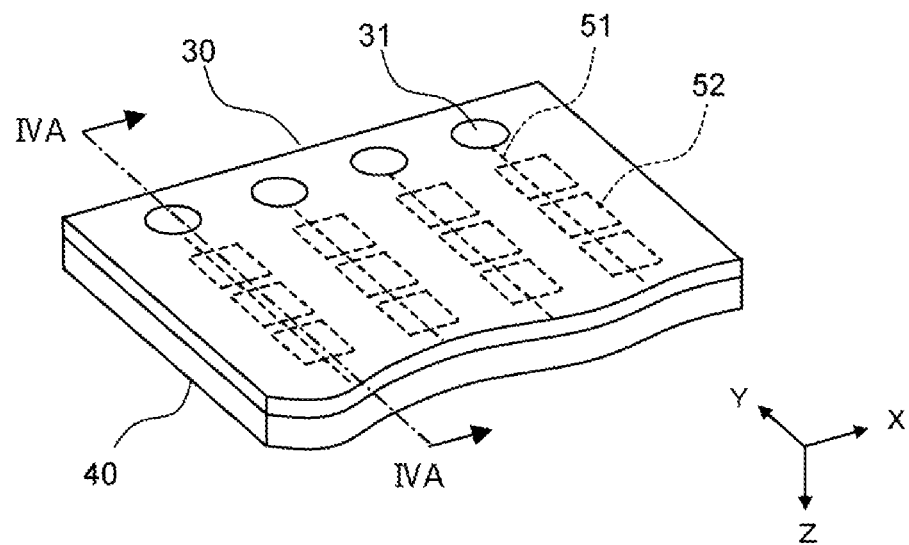
FIG. 2A is an enlarged view of part of the actuator and the structured body according to the exemplary embodiment.

FIG. 2A is an enlarged view of an end part of the configuration in FIG. 1B on the positive Y-axis side. As described above, each main flow path 51 is connected with corresponding ink supply inlets 31 at its ends. A large number of pressure chambers 52 are arranged along main flow path 51, each pressure chamber 52 being connected with main flow path 51 through communicating flow path 53.

In FIG. 1B, eight ink supply inlets 31 are each fitted with a pipe (not illustrated) to which the ink-supplying tube (not illustrated) is connected. The pipe is supported by a support disposed in opening 20a, and the tube connected with the pipe extends to the outside through one of holes 20b. Ink is supplied to each ink supply inlet 31 through the ink-supplying tube and the pipe. Then, the ink is supplied to pressure chamber 52 through main flow path 51 and communicating flow path 53. Ink of the same color is supplied to two ink supply inlets 31 opposite to each other in the Y-axis direction, and ink of mutually different colors is supplied to four ink supply inlets 31 arranged side by side in X-axis direction. Thus, in the configuration in FIG. 1B, ink of four colors is supplied to actuator 30. Accordingly, ink of the same color fills pressure chambers 52 disposed opposite to each other in the Y-axis direction, and ink of mutually different colors fills pressure chambers 52 arranged side by side in the X-axis direction.

Figure 2B:
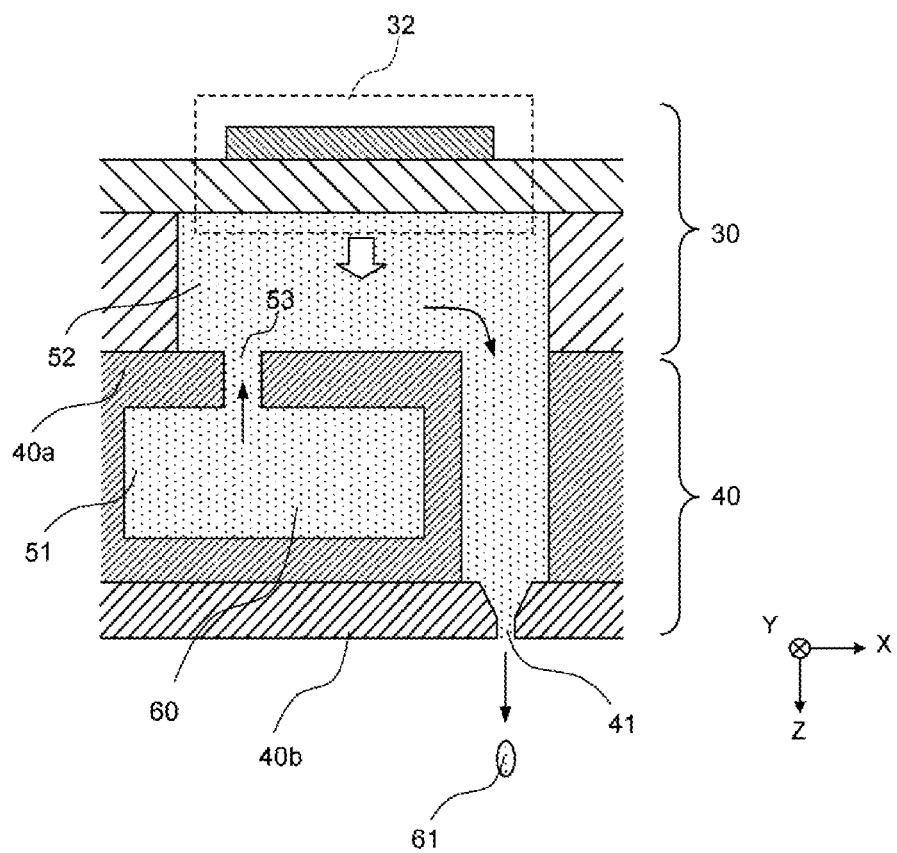
FIG. 2B schematically illustrates a part including a main flow path and a pressure chamber.

FIG. 2B is a sectional view schematically illustrating part of a section of the configuration in FIG. 2A along a plane parallel to the X-Z plane at a central position of pressure chamber 52 in the Y-axis direction.

Ink 60 flowed into main flow path 51 passes through communicating flow path 53 to fill pressure chamber 52. Structured body 40 has upper member 40a including main flow path 51 and communicating flow path 53, and lower member 40b including nozzle 41. Lower member 40b is provided with a circular hole serving as nozzle 41 on a flow path extending in the positive Z-axis direction from pressure chamber 52. Nozzle 41 has a diameter that gradually decreases toward the positive Z-axis direction but is constant near the exit. Actuator 30 is provided with, above pressure chamber 52, piezoelectric drive unit 32 that is deformable in the vertical direction (Z-axis direction). When piezoelectric drive unit 32 deforms downward, the volume of pressure chamber 52 decreases and the pressure of ink 60 filled in pressure chamber 52 increases. Accordingly, droplet 61 of ink 60 is ejected from nozzle 41. Piezoelectric drive unit 32 is individually provided to each pressure chamber 52 shown in FIG. 1B.

According to the present exemplary embodiment, piezoelectric drive unit 32 includes a piezoelectric layer made of a piezoelectric thin film, and a vibration plate configured to deform when the piezoelectric layer deforms. The following describes a specific exemplary configuration of actuator 30.

Comparative Example

First, the configuration of a comparative example will be described.

Figure 3A:
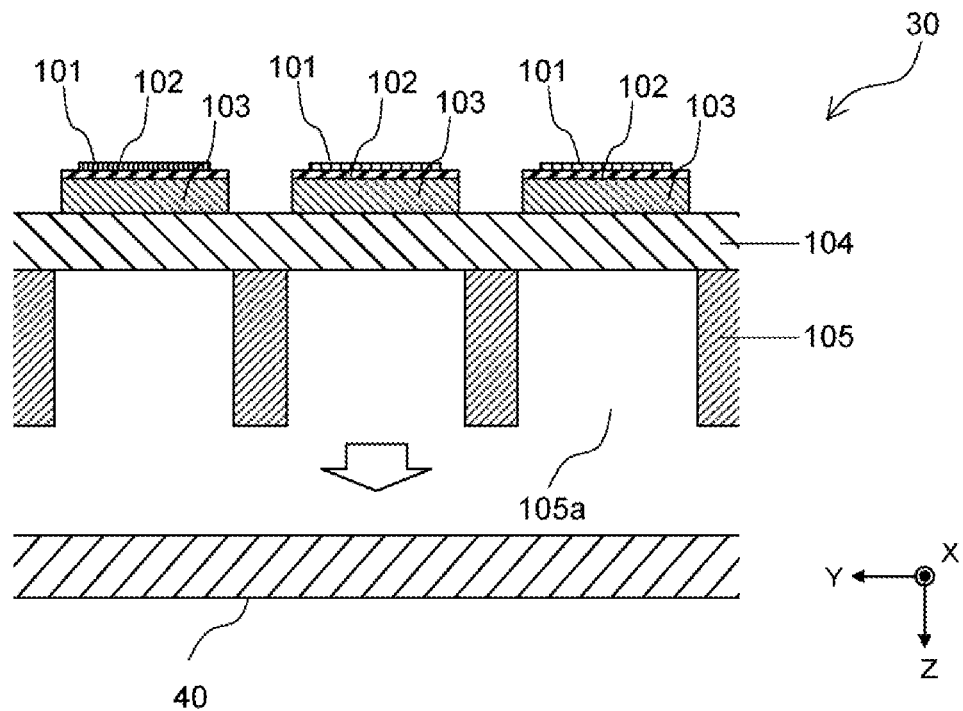
FIG. 3A is a sectional view of the configuration of the actuator and the structured body according to a comparative example.
Figure 3B:
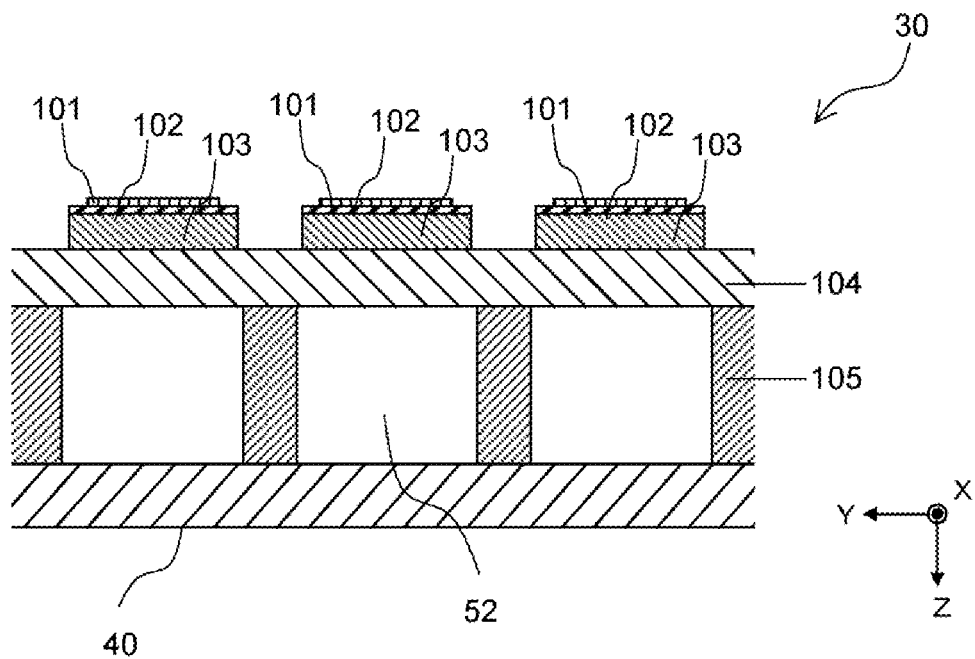
FIG. 3B is a sectional view of the configuration of the actuator and the structured body according to the comparative example.

FIGS. 3A and 3B are each a sectional view schematically illustrating the configuration of actuator 30 and structured body 40 according to the comparative example. FIGS. 3A and 3B are each a sectional view of the configuration of the comparative example along a plane parallel to the Y-Z plane at a position corresponding to plane IVA-IVA in FIG. 2A.

FIG. 3A illustrates a state before actuator 30 is placed on structured body 40, and FIG. 3B illustrates a state after actuator 30 is placed on structured body 40.

As illustrated in FIG. 3A, in the comparative example, actuator 30 has a structure stacking electrode 101, insulating layer 102, piezoelectric layer 103, vibration plate 104, and flow-path forming layer 105.

Electrode 101 is an upper electrode for applying voltage to piezoelectric layer 103. Insulating layer 102 is a layer for insulating electrode 101 from piezoelectric layer 103. Piezoelectric layer 103 is a piezoelectric thin film that vertically deforms when voltage is applied to the piezoelectric thin film, and piezoelectric layer 103 is made of, for example, material including oxide such as lead zirconate titanate (PZT).

Vibration plate 104 is a layer that deforms when piezoelectric layer 103 deforms, and includes a stack of a layer containing chromium (Cr) and a layer containing copper (Cu). Vibration plate 104 is also used as a lower electrode for applying voltage to piezoelectric layer 103.

Flow-path forming layer 105 is a layer for forming groove 105a on the back surface of actuator 30, and is made of, for example, Ni. As illustrated in FIG. 3B, actuator 30 is placed on structured body 40 so that groove 105a of flow-path forming layer 105 is blocked by structured body 40. This forms pressure chamber 52 as described above.

Recently, a need for use of ink-jet head 1 at various temperatures has been increasing. For example, a higher temperature of ink-jet head 1 enables use of ink having a viscosity higher than normal ink. Such a need, however, requires ink-jet head 1 to be usable with no degradation in its characteristic under various environments.

However, according to the comparative example having the above-described configuration, continuous use of ink-jet head 1 at high temperature for a certain period of time degrades the characteristic of piezoelectric layer 103. The inventors of the present application confirmed that this degradation occurred to actuator 30 in which lead zirconate titanate (PZT) was used as material of piezoelectric layer 103. Specifically, the inventors of the present application confirmed that continuous use of ink-jet head 1 at high temperature caused leakage current flowing in piezoelectric layer 103. The inventors of the present application newly found that this phenomenon was caused by an occurrence of reduction reaction in piezoelectric layer 103. The occurrence of reduction reaction in piezoelectric layer 103 causes denaturation of piezoelectric layer 103 and generates a current flowing path in piezoelectric layer 103. Accordingly, leakage current flows in piezoelectric layer 103, which causes reduction in the drive power of piezoelectric layer 103 from a desired drive power. The inventors of the present application assumed that the reduction reaction described above is caused by movement of oxygen in piezoelectric layer 103 when attracted by a metal layer such as the copper (Cu) layer, which is easily oxidized, included in vibration plate 104.

This assumption allowed the inventors of the present application to conceive an idea of newly adding a reduction inhibition layer to actuator 30 so as to inhibit reduction reaction in piezoelectric layer 103. The following describes examples based on this idea.

Example 1

Figure 4A:
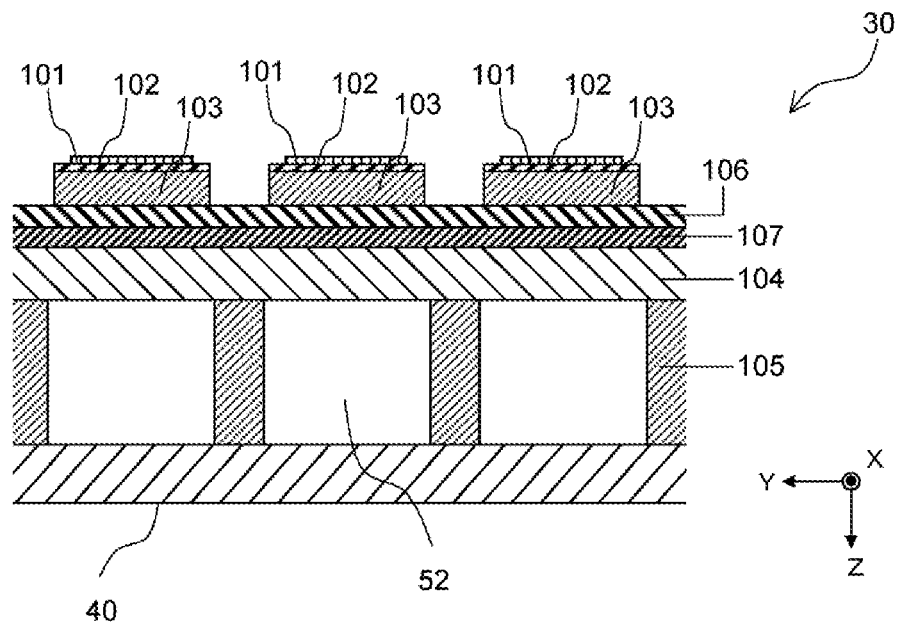
FIG. 4A is a sectional view of the configuration of the actuator and the structured body according to Example 1.

FIG. 4A is a sectional view schematically illustrating the configuration of actuator 30 and structured body 40 according to Example 1. In the same manner as FIGS. 3A and 3B,
FIG. 4A is a sectional view of actuator 30 along a plane parallel to the Y-Z plane at a position of IVA-IVA in FIG. 2A.

The configuration shown in FIG. 4A has a configuration, differing from the configuration of the comparative example, in which insulating layer 106 and reduction inhibition layer 107 are disposed between piezoelectric layer 103 and vibration plate 104. Insulating layer 106 is a layer for insulation in the same manner as insulating layer 102. The material of insulating layer 106 may be composite oxide of PZT added with Nb, La, Sb, Sr, Mn, Mg, or Ni, for example, or may be metallic oxide (magnesium oxide, aluminum oxide, or titanium oxide). This is the same for the material of insulating layer 102.

Reduction inhibition layer 107 is a layer for preventing movement of oxygen from piezoelectric layer 103 to the Cu layer of vibration plate 104. Reduction inhibition layer 107 is made of, for example, material mainly containing Ni. The material of reduction inhibition layer 107 may be any other material that enables the prevention of the movement of oxygen from piezoelectric layer 103 to the Cu layer of vibration plate 104. Reduction inhibition layer 107 only needs to be disposed closer to piezoelectric layer 103 than the Cu layer of vibration plate 104, and thus, for example, reduction inhibition layer 107 may be included in vibration plate 104.

The configuration in FIG. 4A may further include any other layer.

Figure 4B:
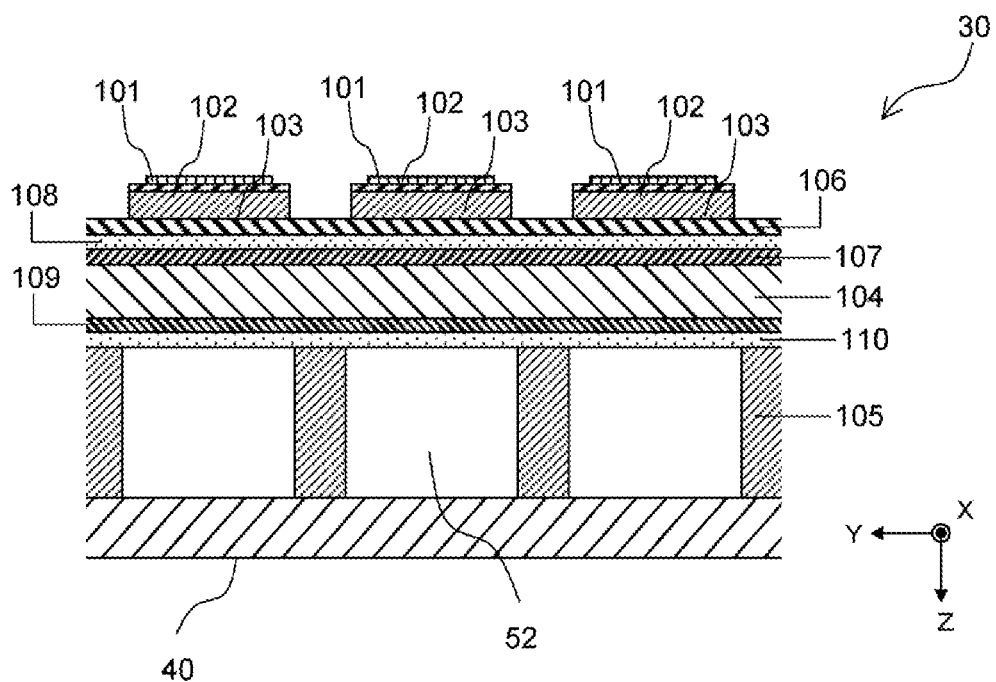
FIG. 4B is a sectional view of the configuration of the actuator and the structured body according to Example 1.

FIG. 4B illustrates an exemplary configuration where the configuration in FIG. 4A additionally includes adhesion layer 108, ink stopping layer 109, and electroforming foundation layer 110.

Adhesion layer 108 is a layer for achieving more excellent formation of the Cr layer located closer to insulating layer 106 within vibration plate 104. Ink stopping layer 109 is a layer for preventing ink from reaching vibration plate 104 from pressure chamber 52, and is made of acrylic resin or polyimide. Electroforming foundation layer 110 is a foundation layer for facilitating formation of flow-path forming layer 105 by electroforming, and is made of, for example, Ni.

Figure 5:
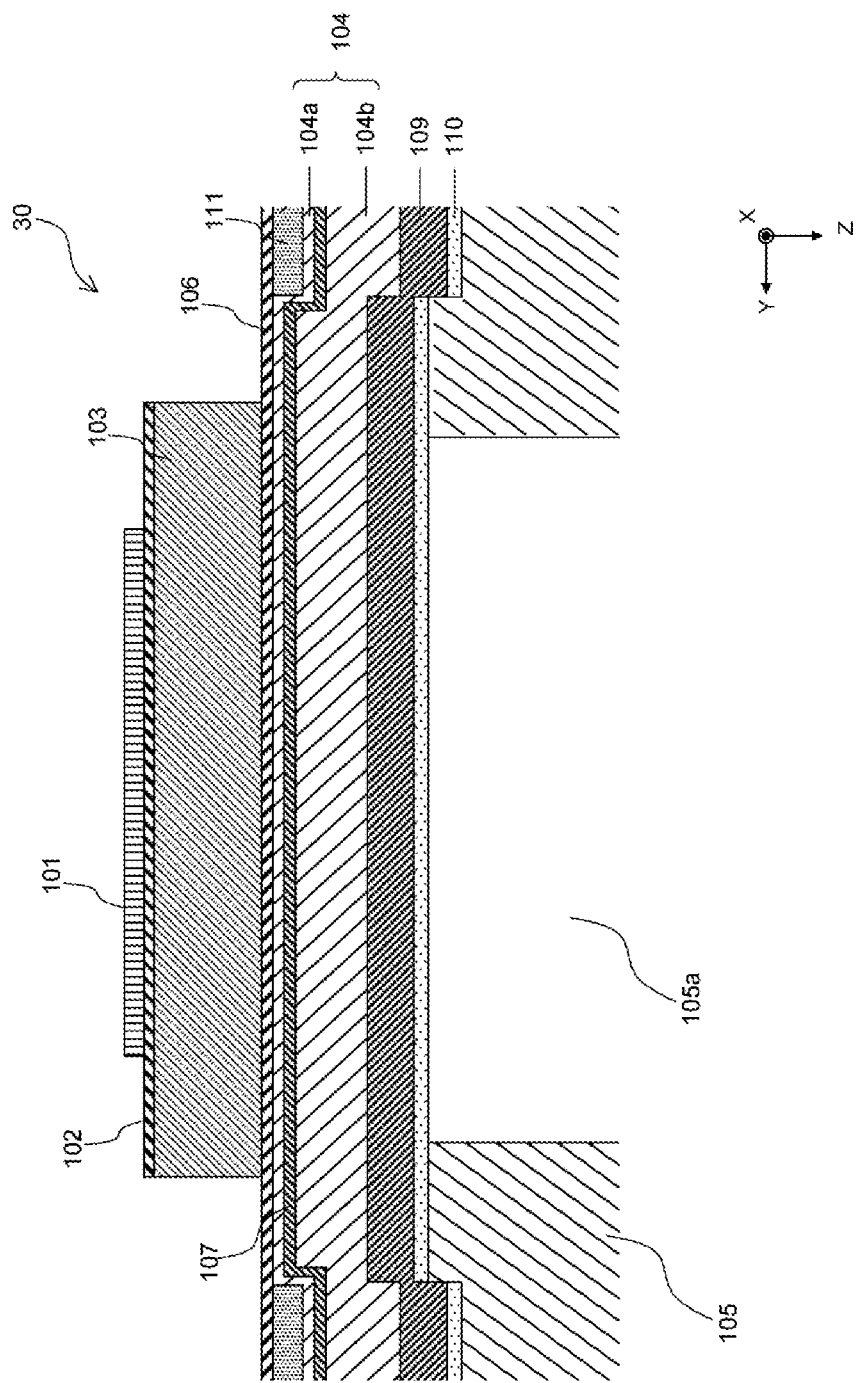
FIG. 5 is a sectional view of the configuration of the actuator near the pressure chamber according to Example 1.

FIG. 5 illustrates a specific exemplary configuration of actuator 30 according to Example 1. In the exemplary configuration in FIG. 5, actuator 30 has a structure stacking electrode 101, insulating layer 102, piezoelectric layer 103, vibration plate 104, flow-path forming layer 105, insulating layer 106, reduction inhibition layer 107, ink stopping layer 109, electroforming foundation layer 110, and interlayer insulating layer 111.

Vibration plate 104 includes Cr layer 104a mainly containing Cr and Cu layer 104b mainly containing Cu. Reduction inhibition layer 107 is disposed between Cr layer 104a and Cu layer 104b. Interlayer insulating layer 111 is an insulating layer for wiring and is made of light-sensitive polyimide. The same materials as described above are used for electrode 101, insulating layer 102, piezoelectric layer 103, flow-path forming layer 105, insulating layer 106, reduction inhibition layer 107, ink stopping layer 109, and electroforming foundation layer 110.

In manufacturing of actuator 30, electrode 101, insulating layer 102, piezoelectric layer 103, the layers of vibration plate 104, insulating layer 106, reduction inhibition layer 107, ink stopping layer 109, and electroforming foundation layer 110 are formed by a sputtering process. Interlayer insulating layer 111 is formed by, for example, applying light-sensitive polyimide to be cured. Flow-path forming layer 105 is formed by electroforming.

Example 2

Figure 6A:
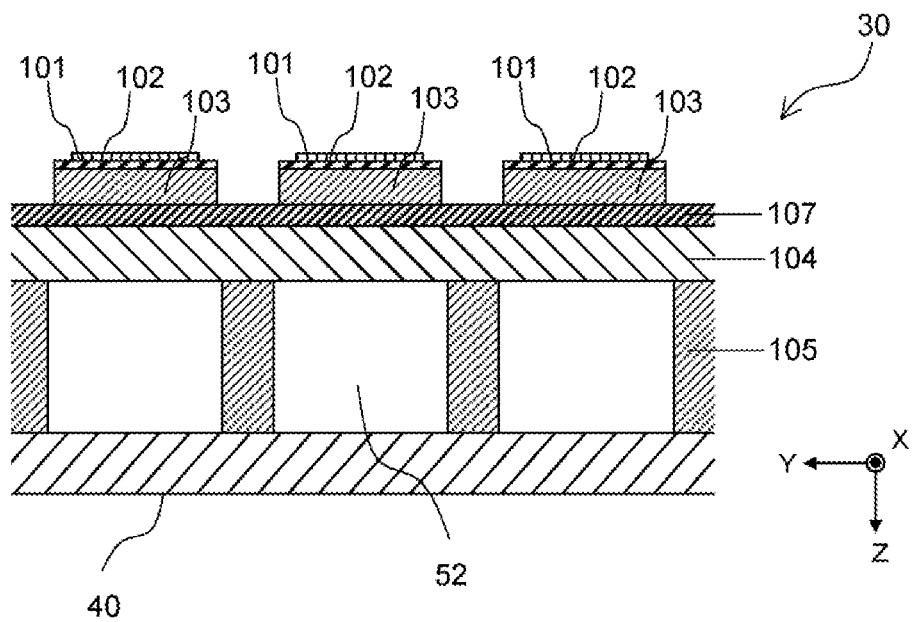
FIG. 6A is a sectional view of the configuration of the actuator and the structured body according to Example 2.
Figure 6B:
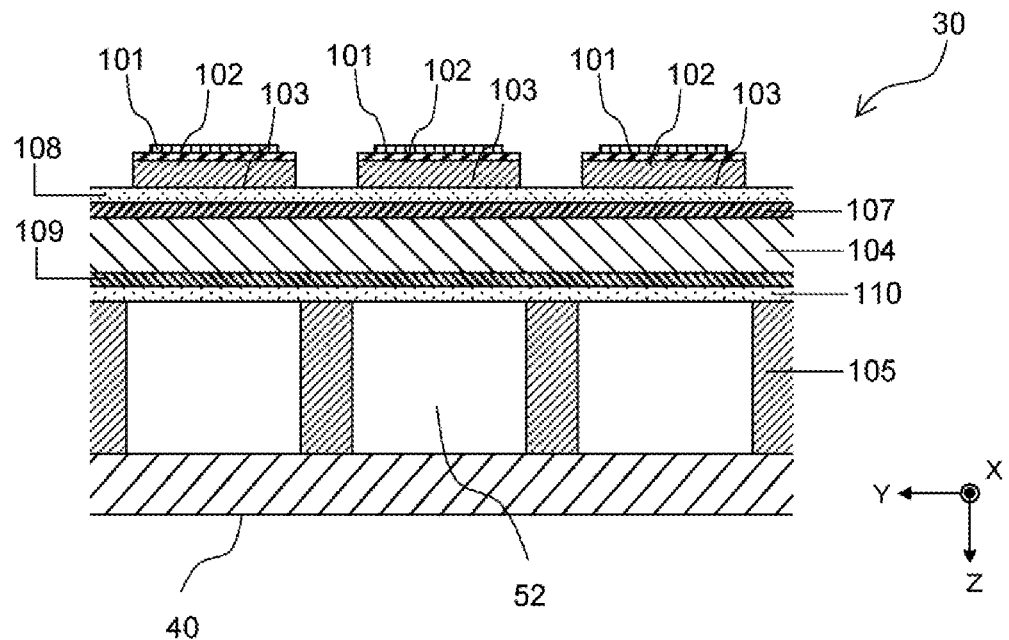
FIG. 6B is a sectional view of the configuration of the actuator and the structured body according to Example 2.

FIGS. 6A and 6B are each a sectional view schematically illustrating the configuration of actuator 30 and structured body 40 according to Example 2. In the same manner as FIGS. 3A and 3B, FIGS. 6A and 6B are each a sectional view of actuator 30 along a plane parallel to the Y-Z plane at a position corresponding to plane IVA-IVA in FIG. 2A.

The configuration shown in FIGS. 6A and 6B does not have insulating layer 106, which is included in the configuration shown in FIGS. 4A and 4B according to Example 1. The configuration shown in FIGS. 6A and 6B is the same as the configuration shown in FIGS. 4A and 4B according to Example 1 except for insulating layer 106.

Figure 7:
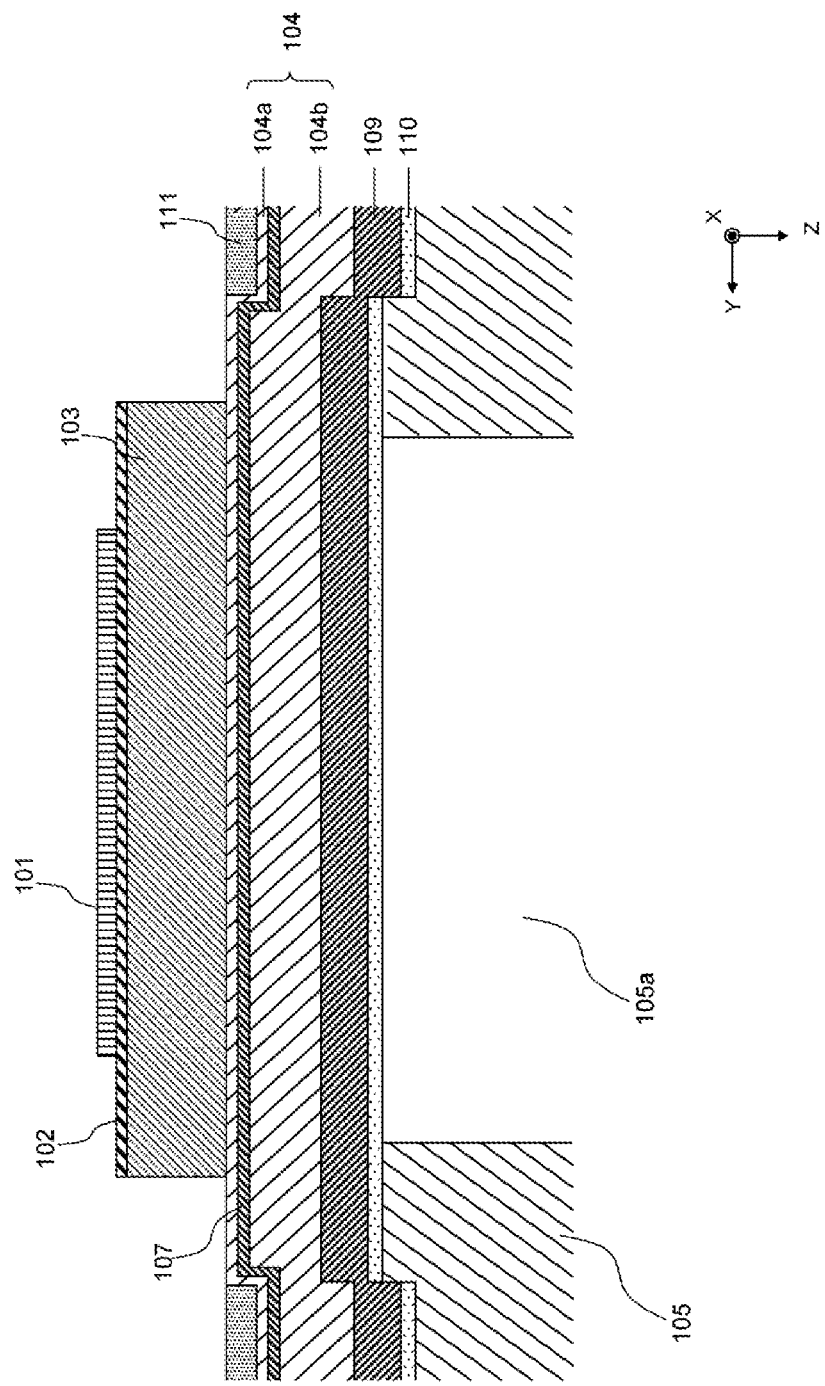
FIG. 7 is a sectional view of the configuration of the actuator according to Example 2 near the pressure chamber.

FIG. 7 illustrates a specific exemplary configuration of actuator 30 according to Example 2. The exemplary configuration shown in FIG. 7 does not have insulating layer 106, which is included in the configuration shown in FIG. 5 according to Example 1. The configuration shown in FIG. 7 is the same as the configuration shown in FIG. 5 according to Example 1 except for insulating layer 106. The process of manufacturing actuator 30 according to Example 2 does not have the forming process of insulating layer 106, which is included in the manufacturing process according to Example 1.

Experiment

The inventors of the present application measured leakage current flowing in piezoelectric layer 103 when actuators 30 according to the comparative example and Examples 1 and 2 are continuously driven. In this experiment, actuators 30 according to Examples 1 and 2 had the configurations shown in FIGS. 5 and 7. Actuator 30 according to the comparative example did not have insulating layer 106 and reduction inhibition layer 107, which are included in the configuration shown in FIG. 5 according to Example 1. Voltage at 35 V was continuously applied to 800 electrodes 101 associated with 800 pressure chambers 52 to measure leakage current flowing in each electrode 101. Actuator 30 was subjected to a temperature of 50° C. in an accelerated test to shorten experiment time.

Figure 8:
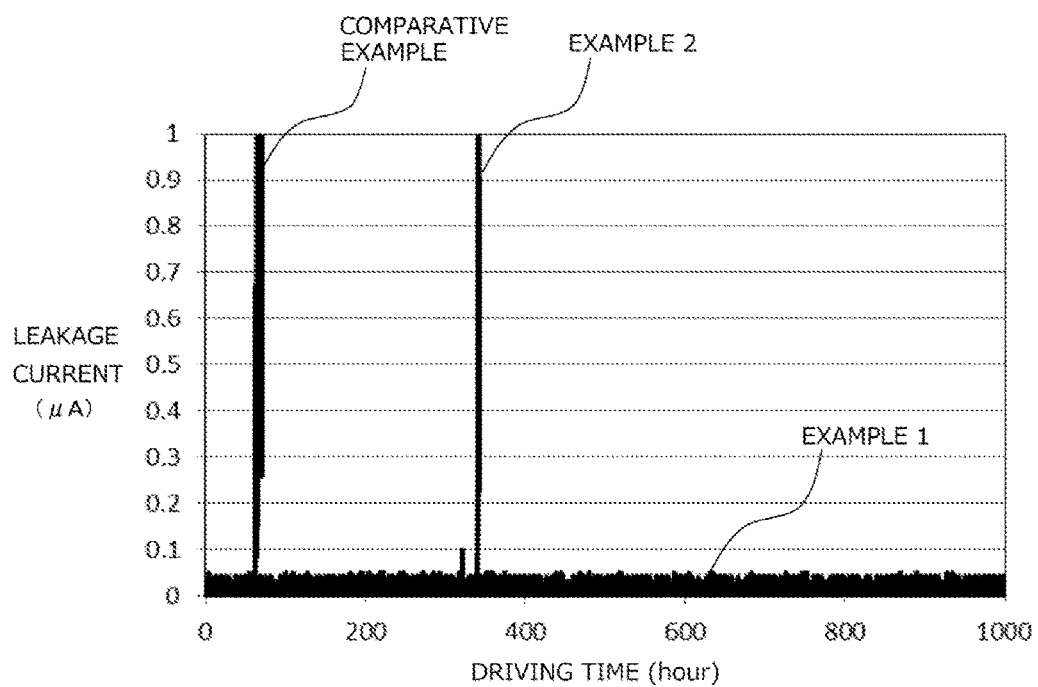
FIG. 8 illustrates a measurement result of leakage current in the actuator having each of the configurations of the comparative example and Examples 1 and 2.

FIG. 8 is a graph illustrating an experiment result. In FIG. 8, the horizontal axis represents a time (driving time) in which the voltage was continuously applied to each electrode 101, and the vertical axis represents current (leakage current) flowing in electrodes 101. The leakage current on the vertical axis is an average current flowing in electrodes 101.

As illustrated in the experiment result in FIG. 8, in the comparative example, the leakage current started flowing in piezoelectric layer 103 in a driving time no longer than 100 hours. In contrast, in Example 2, the leakage current started flowing in piezoelectric layer 103 in a driving time just exceeding 300 hours, which is significantly long as compared to the driving time in the comparative example. This indicates that reduction inhibition layer 107 is effective in preventing the leakage current.

In Example 1, the leakage current did not flow in piezoelectric layer 103 in a driving time exceeding 1000 hours, which indicates that the characteristic of piezoelectric layer 103 was excellently maintained. This confirms that insulating layer 106 together with reduction inhibition layer 107 provide a significant effect in the prevention of the leakage current.

Figure 9:
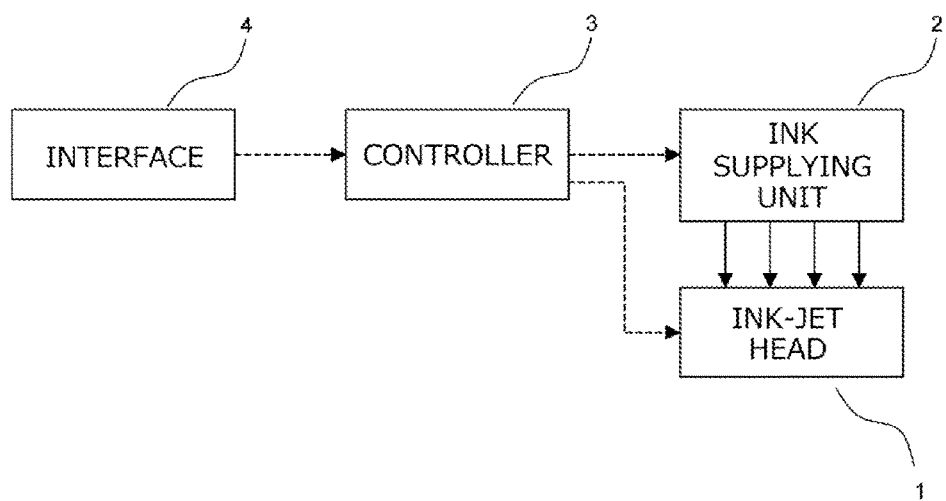
FIG. 9 is a block diagram of the configuration of an ink-jet device according to the exemplary embodiment.

FIG. 9 is a block diagram of the configuration of an ink-jet device according to the exemplary embodiment.

The ink-jet device includes ink-jet head 1 configured as described above, ink supplying unit 2, controller 3, and interface 4. Ink supplying unit 2 includes the above-described tube for supplying ink to ink-jet head 1, an ink tank connected with the tube, and a pump for supplying ink from the ink tank to the tube. Controller 3 includes a CPU and a memory, and controls ink-jet head 1 and ink supplying unit 2 in accordance with a computer program stored in the memory. Interface 4 receives an input of drawing information such as characters and figures to be printed, and outputs this drawing information to controller 3. Controller 3 controls ink-jet head 1 in accordance with the input drawing information so as to perform printing and drawing on a print surface.

Effects of Exemplary Embodiment

The present exemplary embodiment described above achieves the follows effects.

Reduction inhibition layer 107 inhibits reduction reaction in piezoelectric layer 103. As illustrated in FIG. 8, this prevents denaturation of piezoelectric layer 103 such as leakage current flowing in piezoelectric layer 103 even when actuator 30 is continuously used at high temperature. Thus, the characteristic of actuator 30 can be reliably maintained.

In the configuration according to Example 1, insulating layer 106 is disposed between vibration plate 104 and piezoelectric layer 103. As illustrated in FIG. 8, this can prevent the denaturation of piezoelectric layer 103 more significantly. Thus, the characteristic of actuator 30 can be reliably maintained.

Insulating layer 102 is disposed between piezoelectric layer 103 and electrode 101 disposed above piezoelectric layer 103. This can prevent the movement of oxygen from piezoelectric layer 103 to electrode 101, thereby effectively preventing the denaturation of piezoelectric layer 103.

Vibration plate 104 also serves as an electrode disposed below piezoelectric layer 103. This eliminates the need to provide an additional electrode, thereby achieving a simplified configuration of actuator 30.

Modification

The above describes the exemplary embodiment and examples of the present disclosure, but the present disclosure is not limited by the exemplary embodiment and examples in any way.

Figure 10:
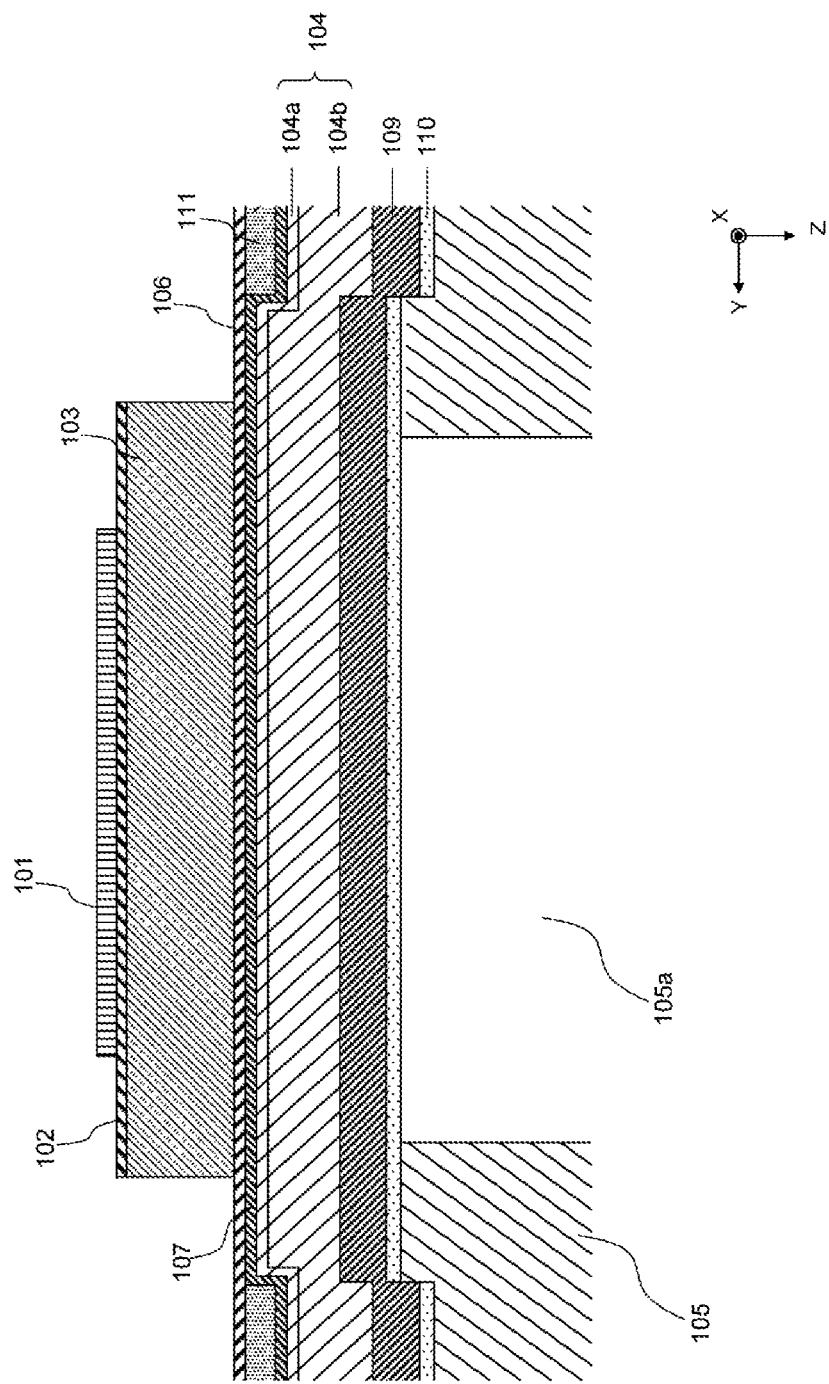
FIG. 10 is a sectional view of the configuration of the actuator according to a modification near the pressure chamber.

For example, in the exemplary configuration (Example 1) in FIG. 5, reduction inhibition layer 107 made of Ni is disposed between Cr layer 104a and Cu layer 104b. The same effect illustrated in FIG. 8 is also expected, when reduction inhibition layer 107 made of Ni is disposed between Cr layer 104a and insulating layer 106 as illustrated in FIG. 10. Similarly, in the exemplary configuration (Example 2) in FIG. 7, reduction inhibition layer 107 made of Ni is disposed between Cr layer 104a and Cu layer 104b. The same effect illustrated in FIG. 8 is also expected, when reduction inhibition layer 107 made of Ni is disposed between Cr layer 104a and piezoelectric layer 103.

Other layers such as those illustrated in FIGS. 4B and 6B may be additionally provided to the exemplary configurations in FIGS. 5 and 7 as appropriate. Alternatively, as illustrated in FIGS. 4A and 6A, any layer may be omitted from the exemplary configurations in FIGS. 5 and 7 as appropriate. The same effect illustrated in FIG. 8 is expected also in these cases.

The number of layers in vibration plate 104 and the composition of each layer are changeable as appropriate. In addition, the configuration and composition of piezoelectric layer 103 are changeable as appropriate.

Ink is supplied from two ink supply inlets 31 disposed opposite to each other in Y-axis direction in the configuration in FIG. 1B. However, one ink supply inlet 31 may be provided for one main flow path, or a flow path and an ink ejection outlet may be provided for ejecting ink flowing from ink supply inlet 31 through pressure chamber 52.

In addition, various kinds of modifications of the exemplary embodiment of the present disclosure may be achieved as appropriate within the scope of the technical idea disclosed in the claims.

What is claimed is:

1. An actuator comprising:
   a piezoelectric layer including an oxide material;
   a vibration plate disposed below the piezoelectric layer, the vibration plate being configured to deform when the piezoelectric layer deforms;
   a reduction inhibition layer disposed between the piezoelectric layer and the vibration plate, the reduction inhibition layer being configured to inhibit reduction reaction in the piezoelectric layer, and
   an insulating layer disposed between the vibration plate and the piezoelectric layer.

2. The actuator according to claim 1, further comprising an insulating layer between the piezoelectric layer and an electrode disposed above the piezoelectric layer.

3. The actuator according to claim 1, wherein the piezoelectric layer is formed of a material including lead zirconate titanate.

4. The actuator according to claim 1, wherein the reduction inhibition layer is formed of a material including Ni.

5. The actuator according to claim 1, wherein:
   the vibration plate serves as an electrode disposed below the piezoelectric layer; and
   a flow-path forming layer for forming a flow path of ink is provided opposite to the piezoelectric layer with the vibration plate interposed between the flow-path forming layer and the piezoelectric layer.

6. The actuator according to claim 5, wherein the vibration plate includes a plurality of layers among which the reduction inhibition layer is provided.

7. The actuator according to claim 6, wherein the vibration plate includes a layer containing Cr, a layer containing Ni, and a layer containing Cu that are stacked in order from the piezoelectric layer, and the layer containing Ni serves as the reduction inhibition layer.

8. An ink-jet head, comprising:
   the actuator according to claim 1;
   a pressure chamber filled with ink and configured to change a pressure of the ink when the actuator is driven; and
   a nozzle configured to eject the ink filled in the pressure chamber when the actuator is driven.

9. An ink-jet device, comprising:
   the ink-jet head according to claim 8; and
   an ink supplying unit configured to supply ink to the ink-jet head.

10. The actuator according to claim 1, wherein the insulating layer extends beyond a periphery of the piezoelectric layer when viewed in plan.

11. An actuator comprising:
    a piezoelectric layer including an oxide material;
    a vibration plate disposed below the piezoelectric layer, the vibration plate being configured to deform when the piezoelectric layer deforms; and
    a reduction inhibition layer disposed in the vibration plate, the reduction inhibition layer being configured to inhibit reduction reaction in the piezoelectric layer, wherein:
    the vibration plate serves as an electrode disposed below the piezoelectric layer,
    a flow-path forming layer for forming a flow path of ink is provided opposite to the piezoelectric layer with the vibration plate interposed between the flow-path forming layer and the piezoelectric layer,
    the vibration plate includes a plurality of layers among which the reduction inhibition layer is provided, and
    the vibration plate includes a layer containing Cr, a layer containing Ni, and a layer containing Cu that are stacked in order from the piezoelectric layer, and the layer containing Ni serves as the reduction inhibition layer.

12. An ink-jet head, comprising:
    the actuator according to claim 11;
    a pressure chamber filled with ink and configured to change a pressure of the ink when the actuator is driven; and
    a nozzle configured to eject the ink filled in the pressure chamber when the actuator is driven.

13. An ink-jet device, comprising:
    the ink-jet head according to claim 12; and
    an ink supplying unit configured to supply ink to the ink-jet head.

* * * * *